United States Patent

[11] 3,615,435

[72] Inventors Victor Fu-Hua Chu
Wilmington, Del.;
Abraham Bernard Cohen, Springfield, N.J.
[21] Appl. No. 775,123
[22] Filed Nov. 12, 1968
[23] Continuation-in-part of Ser. No. 705,323, Feb. 14, 1968
[45] Patented Oct. 26, 1971
[73] Assignee E. I. du Pont de Nemours and Company
Wilmington, Del.

[54] PHOTOHARDENABLE IMAGE REPRODUCTION ELEMENT WITH INTEGRAL PIGMENTED LAYER AND PROCESS FOR USE
13 Claims, No Drawings

[52] U.S. Cl. .......... 96/28, 96/35.1, 96/68, 96/115 P, 96/115 R, 117/34
[51] Int. Cl. .......... G03c 1/68, G03c 11/12
[50] Field of Search .......... 96/28, 35.1, 68, 115 P; 117/34, 16, 33, 29

[56] References Cited
UNITED STATES PATENTS

| | | | |
|---|---|---|---|
| 2,964,401 | 12/1960 | Plambeck | 96/115 (P) X |
| 3,060,025 | 10/1962 | Burg et al. | 96/35.1 X |
| 3,060,026 | 10/1962 | Heiart | 96/27 X |
| 3,157,505 | 11/1964 | Notley | 96/68 |
| 3,244,518 | 4/1966 | Schwerin et al. | 96/35.1 X |

*Primary Examiner*—William D. Martin
*Assistant Examiner*—Ralph Husack
*Attorney*—Lynn Barratt Morris

ABSTRACT: A photohardenable image reproduction element comprising, in order, a support, a layer of clear photohardenable material, and a layer of colored photohardenable material. On imagewise exposure, a latent image is produced comprising selectively photohardened material in both layers. This image is developed by transferring the underexposed areas to a separate image receptive surface The element may have additionally an integral receptor sheet of a material selected according to end use considerations. This element is developed by stripping apart the support and receptor sheets. Cohesive failure occurs in the underexposed areas of the clear photohardenable layer and adhesive failure at the image receptor-photohardened interface of the exposed areas. Sharply defined positive and negative images with low stain are simultaneously produced on the receptor sheet and support respectively.

PHOTOHARDENABLE IMAGE REPRODUCTION ELEMENT WITH INTEGRAL PIGMENTED LAYER AND PROCESS FOR USE

This application is a continuation-in-part of application Serial No. 705,323, filed Feb. 14, 1968 now abandoned.

BACKGROUND OF THE INVENTION

Prior art processes described uncolored photopolymer layers which can be selectively colored by applying dry pigments or pigmented layers to the imagewise exposed, clear photopolymer layers so that the pigments adhere selectively to the underexposed areas. See Burg and Cohen, U.S. Pat. Nos. 3,060,024 and 3,060,025, Oct. 23, 1962. Precolored photopolymerizable layers are described. They are imagewise exposed, brought in contact with a separate receptor using heat and pressure, and then separated from the receptor to yield a transferred image on the receptor. See M. Burg and A. B. Cohen, U.S. Pat. No. 3,060,023.

Photopolymerizable elements with integral cover sheets are described in U.S. Pat. Nos. 3,060,026 and 3,202,508, but these cover sheets are designed to prevent oxygen inhibition during exposure and are removed prior to developing the image.

SUMMARY OF THE INVENTION

This invention relates to a photohardenable image reproduction element comprising in order, (1) a base support, 2) a layer of clear photohardenable material which is strongly adherent to the base support, and (3) a layer of colored photohardenable material. The element may also contain an image-receptive, cover sheet, which may be oxygen-inhibiting, laminated to the top layer of photohardenable material, which is less strongly adherent at room temperature to the colored layer than the base support is to the clear layer. The material of the cover sheet and the chemical constituents of the photohardenable layers can be determined by the use of the element.

A preferred embodiment of the present invention provides a multilayer element comprising, in order, a base support, a clear photopolymerizable layer, a colored photopolymerizable overlayer, and an integral image receptive cover sheet. This embodiment significantly simplifies the procedure of obtaining the desired image by eliminating the need for a separate image receptive layer, and the dusting or laminating processes.

The incorporation of adjacent photopolymerizable layers according to the present invention solves basic problems found in prior elements; that of failure to obtain sharp, high density opaque positive images without background stain on the image receptive surface, and inability to get usable simultaneous negative images free of high density background stain on the base support.

The combination of the dual photohardenable layers offers several distinct advantages not found in the prior art. The presence of colorants is advantageous only in the thin contiguous stratum or overlayer of photohardenable material. Particulate colorants are especially useful and raise the glass transition or softening temperature of underexposed areas of this overlayer to a higher temperature than in the corresponding underexposed areas of the clear photohardenable layer. This causes the underexposed areas of the clear layer rather than those in the colored layer to suffer cohesive failure during stripping, thereby insuring adherence of the complete colored photohardenable layer to the image-receptive surface in these underexposed areas and resulting in higher density positive images on the receptor surface.

In addition, the concentration of all the colorant in the thin overlayer results in sharp positive and negative images by insuring a clean break of the colored layer between exposed and underexposed areas. This concentration of colorant also increases the photosensitivity of the element by eliminating the high degree of actinic light absorption and scattering inherent in those prior art elements in which the colorant is dispersed throughout the entire photopolymerizable layer.

In general the colored overlayer is thinner than the clear underlayer. When particulate coloring material, e.g. pigment, is employed in the element, the relative thickness of the layer does not bear critically on operability because the glass transition temperature increase caused by the presence of pigment particles insures cohesive failure in the clear layer. When homogeneous colorants, e.g. dyes, are used, the relative thickness becomes important, and the overlayer should be much thinner than the clear underlayer to insure cohesive failure in the underlayer. The thickness of the colored layer may vary somewhat, of course, but with pigmented layers, the upper limit of thickness should not, as a practical matter, exceed 0.003 inch. The lower limit is that which will give sufficient color density for the particular end use.

The use of photohardenable material in the colored overlayer, as opposed to nonphotohardenable binder media described in U.S. Pat. No. 3,060,026 and U.S. Pat. No. 3,202,508, results in high resolution and also in low background stain in the positive image.

The negative image remaining on the base support in the present invention is also of high quality and free of stain since only clear photohardenable material remains on the support in the underexposed areas.

An added advantage inherent in the present element is that after stripping, a thin layer of clear photohardenable material covers the colored layer adhering to the image receptor. This layer is able to accept additional coloring matter in order to intensify the color of the colored layer or to change the color of the colored layer. This thin photohardenable layer may be exposed in an imagewise manner and the image developed by methods disclosed in the prior art to form a superimposed image on top of the original image.

The integral image receptive surface of the preferred embodiment of this invention eliminates difficult handling operations in bringing a separate receptor into contact with the photopolymerizable layers following exposure. Since the integral receptor is present during exposure it also eliminates image distortions or loss of registration which could occur in establishing this contact after exposure. Where the receptor is a dimensionally stable material, e.g. a metal, it stabilizes the entire element throughout processing. In addition, the receptor will often be of a material sufficiently impermeable to oxygen to prevent oxygen inhibition of the photopolymerization reaction.

DESCRIPTION OF THE INVENTION

In general, the invention comprises, in order, (1) a base support, (2) a layer of clear photohardenable material which is strongly adherent to the base support, and (3) a second photohardenable layer which contains a pigment or other coloring matter. The element may also incorporate a cover sheet of an oxygen-inhibiting or other image-receptive material laminated to the pigmented layer such that when the element is at room temperature, the adherence between the cover sheet and the pigmented layer is less than that between the base support and the clear layer.

The term "photohardenable" as used herein refers to systems in which the molecular weight of at least one component of a photosensitive layer is increased by exposure to actinic radiation. Where the photohardenable component is a major constituent of said layer the increase in molecular weight caused by the actinic radiation causes a change in the rheological and thermal behavior in the exposed areas.

Among suitable photohardenable systems are:

1. those where a photopolymerizable monomer is present alone or in combination with a compatible binder, or
2. those in which the photopolymerizable group is attached to a polymer backbone which becomes activated on exposure to light and may then crosslink by reacting with a similar group or other reactive sites on adjacent polymer chains. In the second group of suitable photopolymerizable systems, where the monomer or pendant photopolymerizable group is capable of addition polymerization, e.g., a vinyl monomer, the photopolymerized chain length may involve addition of many similar units initiated by a single photochemical act. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced. Suitable embodiments of the present invention may also include combinations of the different systems described above.

The term "underexposed" as used herein is intended to cover the image areas of the photohardenable layers which are completely unexposed or those exposed only to the extent that there is hardenable compound still present in sufficient quantity that the molecular weight remains substantially lower than that of the complementary exposed image areas. The term "stick temperature" as applied to either an underexposed or exposed area of a photohardenable stratum means the minimum temperature at which the image area in question sticks or adheres, within 5 seconds, under slight pressure, e.g., thumb pressure, to analytical paper (Schleicher & Schull analytical filter paper No. 595) and remains adhered in a layer of at least detectable thickness after separation of the analytical paper from the stratum.

In the photohardenable image reproduction element, the base support is a material which is stable at the operating temperatures of the element. The base support may be coated with a subbing solution as described in U.S. Pat. No. 2,779,684, example IV, to enhance the anchorage of the clear photopolymerizable layer to the base support and insure that said anchorage at room temperature is greater than that between the cover sheet and the colored photopolymerizable layer.

If either a simple monomer or monomer-polymer binder system is being used as the bottom, clear photopolymerizable layer, the preferred element contains a free radical generating, addition polymerization initiator activatable by actinic radiation in this layer. If a photocrosslinkable polymer or dimer system is used, the preferred element may contain a plasticizing agent along with such crosslinkable or dimerizable material. The overlayer of photohardenable material contains, in addition to those constituents of the desired clear photohardenable layer, colored matter, e.g. pigment, lake, dye, etc.

The cover sheet may be substantially impervious to oxygen and thermally stable in the range of operating temperatures. The material used in the cover sheet will be determined by the end use of the element.

Suitable free radical initiated, chain propagating addition polymerizable ethylenically unsaturated compounds for use in the simple monomer or monomer-polymer binder photopolymerizable layers are disclosed in U.S. Pat. Nos. 3,060,023 and 3,261,686, and Cohen & Schoenthaler U.S. Pat No. 3,380,831, Apr. 30, 1968. Suitable polymers for use in the monomer-polymer binder system are disclosed in the above-mentioned U.S. Pat. No. 3,060,023, as are preferred free radical generating addition polymerization initiators, activatable by actinic light, e.g., ultraviolet and visible light. The initiator compositions of photographic silver halide sensitizing agents and bromine donor compounds or reducing aliphatic amines of Belgian Pat. Nos. 682,048 and 682,052, Dec. 5, 1966, are also useful in the photohardenable layers of this invention. Dye-Redox initiated photopolymer systems incorporating leuco triphenyl-methane dye or a lophine dimer or both as shown in Belgian Pat. No. 681,944, Dec. 1, 1966, may also be used.

Photodimerizable materials useful in the invention are cinnamic acid esters of high molecular weight polyols, polymers having chalcone and benzophenone type groups, and others disclosed in chapter four of "Light-Sensitive Systems" by Jaromir Kosar published by John Wiley & Sons, Inc., New York. Photohardenable materials capable of photocrosslinking with more than one adjacent polymeric chain to form a network as described in patent applications by Schoenthaler U.S. Ser. No. 451,300 filed Apr. 27, 1965 (U.S. Pat. No. 3,418,295, Dec. 24, 1968) and Celeste, Ser. No. 477,016 filed Aug. 3, 1965 now abandoned, but first refiled as Ser. No. 759,217, Sept. 11, 1968 (U.S. Pat. No. 3,469,982, Sept. 30, 1969), are useful in this invention.

Where the polymer is a hard, high melting compound a plasticizer is usually used to lower the glass transition temperature and facilitate selective stripping. The plasticizer may be a monomer itself, e.g., a diacrylate ester, or any of the common plasticizers which are compatible with the polymeric binder. Among the common plasticizers are dialkyl phthalates, polyethylene glycol and alkyl phosphates.

The colored layer (1) may be coated over the clear layer, or (2) may be coated on the cover sheet which is then laminated to the support with its coated layer contiguous to the clear photohardenable layer. In a preferred embodiment, (3) a pigment color layer is created by applying the pigment colored matter to the clear layer and then pressing it into the surface of the clear layer, such that it is concentrated at the receptor face and penetrates to only a fraction of the depth of the clear photohardenable layer. The pigment colored matter, in addition to coloring this layer and raising its softening temperature, lowers the adhesion between the colored layer, at room temperature and the cover sheet, a desired effect. Concentrating the pigment in a thin layer also markedly improves image resolution. The photohardenable materials may be the same or different in each layer. Generally the same photohardenable materials are used in each layer while the concentrations in the different layers can vary. If two different photohardenable materials are used, the material with the higher softening temperature should be in the colorant containing layer.

The various dyes, pigments, thermographic compounds, color forming components and organic or inorganic fillers which may be added to the photohardenable overlayer are disclosed in column six of U.S. Pat. No. 3,060,026. The particulate coloring components, e.g., pigments, are preferred for the overlayer. This patent also describes the various base support materials and additives to it to obtain desired physical characteristics. Such supports include the polyester, polyamide and cellulose ester or ethers.

The cover sheet may perform one or both of the following two functions, that of an oxygen inhibitor, thereby shielding the photohardenable material from oxygen which may tend to decrease its sensitivity to light, and that of an image-receptive surface to which unhardened material from the underexposed areas of the pigmented and clear layers adhere during thermal or pressure stripping of the element. As such, its material may be determined by its imperviousness to oxygen, by the end use of the element, or both. Materials such as polyethylene terephthalate, glass, various types of paper, metal sheets, foils, e.g., aluminum, copper, etc., and others may be used as cover sheets.

The invention will be further illustrated by, but is not intended to be limited to, the following detailed examples of various embodiments.

EXAMPLE 1

The following solutions were prepared:

| Component | Sol. A. | Sol. B. |
|---|---|---|
| 1. 25% Methyl methacrylate polymer/trichlorethylene | 360.0 g. | 360.0 g. |
| 2. Polyoxyethyl trimethylolpropane triacrylate | 80.0 g. | 80.0 g. |
| 3. Trichlorethylene | 600.0 g. | 400.0 g. |
| 4. 2-Ethylanthraquinone | 1 1 g. | 1.1 g. |
| 5. Polyethylene glycol mono-lauryl ether | 15.0 g. | 15.0 g. |
| 6. Bring total weight with trichlorethylene to: | 1,250.0 g. | 1,000.0 g. |

Both solutions were stirred at room temperature for about 30 minutes in brown bottles provided with magnetic stirring elements. Each solution was coated on a separate 0.004-inch thick polyethylene terephthalate base support which was resin subbed (see U.S. Pat. No. 2,779,684, example IV) to insure good anchorage between it and the photopolymerizable coating. The coating was allowed to dry.

Part A

Benzidine Yellow toner (C.I. Pigment Yellow 12) was applied lightly with a brush to the surface coated with solution A, the excess toner being removed with a brush and an absorbent cotton pad. The toned photopolymerizable coating was laminated with a 0.001-inch thick polyethylene terephthalate film. The laminating conditions were: temperature, 125° C.; speed 60 in./min.; nip force of 4 lbs./in. of nip length. The integral pretoned film element was exposed through a positive halftone transparency from the base support side using a nuArc "Flip Top" Plate Maker, Model FT 26M–2 carbon arc light source. The cover sheet was separated from the base at a temperature of 125° C. and a stripping rate of 60 in./min., resulting in a sharp, yellow positive image adhering to the cover sheet and a complementary negative image remaining on the base support.

Part B

Jungle Black toner (C.I. Pigment Black 1) was applied to the clear photopolymerizable solution (solution B) by cascading it four or five times over the polymer surface and blowing off the excess with an air hose. The toned photopolymerizable layer was then laminated to the drafting film described in U.S. Pat. No. 2,964,423, Dec. 13, 1960, example II, at a temperature of 240° F., laminating speed of 36 in./min., and pressure of 20 p.s.i.

A halftone exposure was made through the base support side in a Bruning White Printer, Model Revolute Rockette at a speed setting of 05. A high quality positive black image formed on the drafting film upon delamination at a temperature of 240° F. and stripping speed of 15 in./min.

EXAMPLE 2

Three sheets of polyethylene terephthalate base support material were coated with photopolymerizable material solution B as described in example 1. Jungle Black toner (C.I. Pigment Black 1) was applied to each photopolymerizable layer using a brush and absorbent cotton pads. cover sheets of copper, aluminum, and glass were laminated, one on each base support, at a temperature of 100° C., a lamination speed of 30 in./min., and a nip force of 4 lbs./in. of nip length.

Each element was exposed through the base to the nu Arc carbon arc light source described in example 1 for 50 seconds through a positive transparency containing signal strips, a dot gain scale and dot size comparators of 65- to 150-line screens. Thermal stripping was accomplished at the same temperature and speed as lamination. Each cover sheet was post heated after stripping, on a "Pyrex" Radiant Heater manufactured by Corning Glass Works, Cat. No. 604,077, the copper plate at 210° C. for 1 minute and the glass at 100° C. for 15 minutes. Sharp positive images were obtained on the cover sheets in all three cases with the complementary negative images remaining on the base supports. Both images were black.

EXAMPLE 3

The following solution was prepared:

| Component | |
|---|---|
| 1. Pentaerythritol triacrylate | 75.0 g. |
| 2. Trichlorethylene | 400.0 g. |
| 3. 25% Methyl methacrylate polymer/trichlorethylene | 360.0 g. |
| 4. 2-Ethylanthraquinone | 1.05 g. |
| 5. Polyethylene glycol mono lauryl ether | 15.0 g. |
| 6. Ethyl violet | 0.9 g. |
| 7. Bring total weight with trichlorethylene to: | 1,000.0 g. |

The solution was stirred in a sealed brown bottle for one-half hour, coated on two 0.004-inch thick, subbed polyethylene terephthalate base supports and allowed to dry. Jungle Black toner (C.I. Pigment Black 1) was applied to the polymerizable layer on each support by the cascading method described in example 1. One base support was laminated to a cover sheet of sodium silicate coated, grained aluminum sheet with 5-micron grain depth; the other support to a cover sheet of cleaned copper plate. The laminating conditions were the same for both: temperature 150° C., nip force 4 lbs./in. of nip length, and a speed of 30 in./min.

The aluminum plate element was exposed from the base side to a halftone image; the copper plate to a high contrast, three line, three-to-one ratio, equal line distance resolving power chart. Exposure was for 1 minute to the nuArc carbon arc in example 1. Thermal stripping was conducted at the same conditions of temperature and speed as lamination, and both elements were subjected to a post-heating treatment on the Corning "Pyrex" Radiant Heater described in example 2 for 30 seconds at 200° C.

The positive image on the copper cover sheet had a resolution of 16 lines/mm. and was a good resist for etching unprotected areas with $FeCl_3$. The aluminum plate was post exposed to the nu Arc carbon arc for 10 minutes. It was then treated with gum arabic and dried with an air hose. A good quality lithographic printing plate was obtained wherein the photopolymer image was oleophilic and the aluminum was oleophobic.

EXAMPLE 4

A solution was prepared as in example 3, except that 100.0 g. of pentaerythritol triacrylate and 350.0 g. of trichlorethylene was used to make 900.0 g. of solution. The same base support, toning materials and lamination procedure were used as in example 3, except a lamination temperature of 155° C. was used. The cover sheet material was zinc plate. Exposure was by nu Arc carbon arc for 1 minute, and thermal stripping was at the same conditions of temperature and speed as lamination.

A 45-second post heat treatment at 200° C. on the Corning "Pyrex" Radiant Heater and a 9-minute post exposure on the nu Arc carbon arc light source was given to the delaminated zinc plate.

A good, deep etched, image (0.010 in. deep) was obtained by etching the cover plate in 2N nitric acid for 23 minutes.

EXAMPLE 5

A one-half quantity of Solution B in example 1 was prepared, except that 37 5 g. instead of 40.0 g. of polyoxyethyl trimethylolpropane triacrylate was used, and the 2-ethylanthraquinone photoinitiator was replaced by 0.12 g. of methylene blue in 13.2 g. of methanol, and 6.0 ml. of triethanolamine. Jungle Black toner (C.I. Pigment Black 1) was applied as in example 1 B. A 0.001 in. polyethylene terephthalate cover sheet was laminated to the base support.

A 50-sec. exposure was made as in example 1 A. The cover sheet was stripped at the same conditions of temperature and speed as at lamination. A good positive black image was obtained on the cover sheet, the opacity of which was increased by dusting the cover sheet with Jungle Black toner and blowing the excess off with an air hose.

EXAMPLE 6

Solution A

| Component | |
|---|---|
| 1. Methylene chloride | 85.0 g. |
| 2. Methyl methacrylate polymer | 3.0 g. |
| 3. Piperazine-2-urethane | 3.0 g. |
| 4. Polyoxyethyl trimethylolpropane triacrylate (as in Example 1) | 4.0 g. |
| 5. 2-Ethylanthraquinone | 0.2 g. |
| 6. Bring total weight with methylene chloride to. | 100.0 g. |

Solution A was stirred in a brown bottle with a magnetic stirrer for 10–20 minutes.

Solution B

| Component | |
|---|---|
| 1. Trichlorethylene | 70.0 g. |
| 2. 25% Methyl methacrylate polymer/trichlorethylene | 10.0 g. |
| 3. Polyoxyethyl trimethylolpropane triacrylate | 1.5 g. |
| 4. Impingement-type carbon black, 10 mμ particle size | 2.75 g. |
| 5. 2-Ethylanthraquinone | 0.16 g. |
| 6. Bring total weight with trichlorethylene to | 100.0 g. |

Solution B was ball milled in a brown bottle with 20, ⅝-inch diameter ceramic balls for 24 hours.

Solution A was coated on a 0.001-inch thick polyethylene terephthalate base support which was coated with a subbing solution of 90/10/1 vinylidene chloride/acrylonitrile/itaconic acid copolymer. Solution A was applied with a 0.004-inch doctor knife and was allowed to air dry at room temperature. Solution B was coated on a cover sheet of film described in example 1 B using a 0.004-inch doctor knife and was also allowed to air dry.

The two coated films were laminated with the coated layers contiguous to each other at the following laminating conditions: temperature 110° C., pressure 30–50 p.s.i.a., speed 60 in./min.

The element was exposed from the base side through the positive flat of example 2 in the nu Arc carbon arc light source for 3 minutes. Thermal stripping at the same conditions of temperature and speed as at lamination yielded a well-defined positive image on the drafting film and the corresponding negative image on the polyethylene terephthalate base support.

EXAMPLE 7

The following solution was prepared:

| | |
|---|---|
| 1. Polyethylene glycol diacrylate | 24.0 g. |
| 2. p-Methoxyphenol | 24 mg. |
| 3. Cellulose acetate butyrate | 6.0 g. |
| 4. Phenanthrenequinone | 93.0 mg. |
| 5. Acetone to bring the total weight of solution to | 185.0 g. |

The cellulose acetate butyrate contained ca. 13 percent acetyl groups, ca. 37 percent butyral groups and had a viscosity of 64 to 124 poises as determined by ASTM method D-871-4T in solution described as formula A, ASTM method D-871-54T. The polyethylene glycol diacrylate was derived from polyethylene glycol with an average molecular weight of 300.

This solution was coated onto a 0.001-inch thick polyethylene terephthalate film to a wet thickness of 0.006-inch. The coating was allowed to stand in air for 20 minutes while the solvent evaporated, leaving a viscous, syrupy layer. Jungle Black toner (C.I. Pigment Black 1) was applied to the polymerizable layer by the cascading method of example 1. A second sheet of 0.001-inch thick polyethylene terephthalate film was then rolled onto the coating, resulting in a thin pigmented, photopolymerizable layer being formed contiguous to the clear photopolymerizable layer The laminated element was exposed through its base side to a transparency bearing a line and letter text image for 5 seconds using a General Electric Company Type RSP 2 Photospot lamp supported 2 feet from the element. The cover sheet was then peeled from the element, and the colored photopolymerizable layer was placed in contact with a piece of bond receptor paper and pressed firmly against it by hand. The element was then separated from the paper leaving a well defined black image of the original transferred to the receptor paper.

EXAMPLE 8

The following solutions were prepared:

Solution A

| Component | |
|---|---|
| 1 19% Methyl methacrylate polymer/trichlorethylene | 5,600.0 g. |
| 2. Polyoxyethyl trimethylolpropane triacrylate | 1,000.0 g. |
| 3 Trichlorethylene | 2,000.0 g. |
| 4 2-Ethylanthraquinone | 10.0 g. |
| 5 Polyethylene glycol mono lauryl ether | 150.0 g. |

Solution A was stirred in brown bottles with magnetic stirrers for approximately 30 minutes.

Solution B

| Component | |
|---|---|
| 1. Methyl methacrylate polymer | 80.0 g. |
| 2. Polyoxyethyl trimethylolpropane triacrylate | 30.0 g. |
| 3. Jungle Black toner (C.I. Pigment Black 1) | 17.0 g. |
| 4. 2-Ethylanthraquinone | 3.2 g. |
| 5. Trichlorethylene | 400.0 g. |

Solution B was sand milled for 10–20 minutes using 892 g. of Ottawa sand. The solution was filtered off and the sand washed in acetone.

Solution A was coated on a base support of 0.001-inch thick polyethylene terephthalate, subbed as in example 6, using a 0.004-inch doctor knife spacing. The solution was allowed to dry in air at room temperature.

The dry layer of Solution A was overcoated with solution B, using a 0.002-inch doctor knife spacing and allowed to dry in air at room temperature.

A cover sheet of 0.005-inch uncoated, biaxially stretched polyethylene terephthalate film was laminated to the Solution B layer at the following laminating conditions: temperature 120–130° C., pressure 30–50 p.s.i., and speed of 60 in./min.

The laminated element was exposed through the base side through a positive, 150 line, halftone transparency for 4 minutes, and delaminated at 110° C. and a speed of 60 in./min. A sharp positive image, free from background stain was obtained on the cover sheet. The image was black.

EXAMPLE 9

A thermoplastic photopolymerizable composition was prepared from 12 g. of low viscosity polyvinyl acetate/methacrylate (containing a maximum of 20 mole percent of methacrylate groups and prepared by esterification of 86–89 percent hydrolyzed polyvinyl alcohol), 12 ml. of ethanol, 2.54 g. of polyethylene glycol diacrylate (average molecular weight of precursor is 300), 0.009 g. of anthraquinone and 0.009 g. of p-methoxyphenol. The composition was coated to a dry thickness of 0.002-inch on a 0.004-inch thick sheet of polyethylene terephthalate subbed with the solution of vinylidene chloride/methyl acrylate/itaconic acid copolymer of U.S. Pat. No. 2,627,088.

Jungle Black toner (C.I. Pigment Black 1) was applied to the clear coating and a 0.001-inch thick, unsubbed polyethylene terephthalate sheet was laminated to the toned photopolymerizable layer at the following conditions: temperature 125 °C., speed 60 in./min., and nip force of 4 lbs./in of nip length.

The element was exposed through the base side by passing light from an 1800-watt, high pressure mercury arc lamp through a positive halftone transparency. Thermal delamination at the same conditions of temperature and speed as during lamination yielded a sharp positive image on the cover sheet and the complementary negative image on the base support. Both images were black

EXAMPLE 10

The following solution was prepared:

Solution B

| Component | |
|---|---|
| 1. Methyl methacrylate polymer | 40.0 g. |
| 2. Polyoxyethyl trimethylolpropane triacrylate | 20.0 g. |
| 3. Jungle Black toner (C.I. Pigment Black 1) | 17.0 g. |
| 4. 2-Ethylanthraquinone | 3.2 g. |
| 5. Trichlorethylene | 550.0 g. |

Solution A from example 8 was coated on a 0.0075-inch thick polyethylene terephthalate base support which was coated with a subbing solution of 90/10/1 vinylidene chloride/acrylonitrile/itaconic acid copolymer. Solution A was applied with a 0.004-inch doctor knife and was dried in air at room temperature. Solution B, as described above, was coated over the clear photopolymerizable layer, using a 0.004-inch doctor knife, and was allowed to dry in air at room temp.

The coated element was cut into two pieces. Both pieces were exposed through a 150-line halftone positive transparency on the nu Arc carbon arc of example 1 for 4 minutes.

One piece of coated element was laminated to a sheet of white paper, and transfer to the paper of a sharp, positive image was effected by delaminating the paper image receptor at the following conditions, temperature—130 °C.; speed–0.5 in./sec.

The second piece of coated element was subjected to a bath of anhydrous methyl alcohol. This piece was submerged for approximately 90 seconds, with agitation. A negative image remained on the base support.

EXAMPLE 11

The following solution was prepared:

| Component | |
|---|---|
| 1. Trichlorethylene | 400.0 g. |
| 2. Methyl methacrylate polymer | 90.0 g. |
| 3. Polyoxyethyl trimethylolpropane triacrylate | 100.0 g. |
| 4. 2-Ethylanthraquinone | 1.0 g. |
| 5. Polyethylene glycol mono lauryl ether | 15.0 g. |
| 6. Bring total weight with trichlorethylene to: | 1,000.0 g. |

The solution was stirred for 1 hour. The solution was coated to a dry coating weight of 184 mg./dm.$^2$on a sheet of 0.004-inch thick polyethylene terephthalate subbed as in example 1 and allowed to dry. Jungle Black toner (C.I. Pigment Black 1) was applied to the clear photopolymerizable material, and a 0.001-inch thick uncoated polyethylene terephthalate cover sheet was laminated to the photosensitive layer. The element was exposed in the nu Arc carbon arc for 4 minutes through the halftone transparency of example 2.

The cover sheet was removed at room temperature and no unpolymerized material adhered to it. The base support was then soaked for a total of 2 minutes in a solution of: methanol—90 ml., dioctyl sodium sulfosuccinate and water (0.98–1.02 percent solids)—10 ml., water—$\beta$- 10 percent,' and dried with compressed air. The unpolymerized material on the support was washed off, leaving a high maximum density, sharp, black negative image which was of better quality than achieved with the no-cover sheet, solvent-bathed element in example 10.

EXAMPLE 12

The following solution was prepared:

| Component | |
|---|---|
| 1. Polyvinyl cinnamate (Made by reacting low viscosity polyvinyl alcohol, 87.7–89.0% hydrolyzed with cinnamoyl chloride to achieve 98.6% substitution of the OH groups) | 3.6 g. |
| 2. 2-t-Butylanthraquinone | 0.4 g. |
| 3. Bring total weight with trichlorethylene to: | 20.0 g. |

The solution was coated on a sheet of 0.001-inch polyethylene terephthalate which was coated with the subbing compound of example 6. The solution was applied with a 0.004-inch doctor blade setting and dried. The photosensitive layer was then dusted with Jungle Black toner (C.I. Pigment Black 1) and a cover sheet of cleaned copper plate was laminated over the pigment, driving it part way into the clear photodimerizable layer.

The element was exposed for 7 minutes on through a transparency containing line and solid image areas, to the nu Arc carbon arc light source of example 1.

The element was heated to approximately 100 °C. and while at that temperature, the cover sheet was stripped from the support. The undimerized material failed cohesively in the clear layer and resulted in a clear, opaque, positive copy of the original image adhering to the copper cover sheet.

EXAMPLE 13

The coating solution described in example 1 of patent application by J. R. Celeste, U.S. Ser. No. 533,817, filed Mar. 14, 1966, U.S. Pat. No. 3,448,089, June 3, 1969) containing a photocrosslinkable polymer, 2-t-butylanthraquinone photoinitiator, and triethylene glycol diacetate plasticizer, was coated on a copper-clad fiberglass support as in the above-mentioned example 1. The dried photopolymerizable layer was dusted with Monastral Blue (C.I. Pigment Blue 15), and a 0.001-inch thick sheet of unsubbed polyethylene terephthalate was laminated over the pigment.

The element was exposed through the cover sheet for 1 minute, through a lithographic-type negative, in the nu Arc carbon arc light source of example 1. After exposure, the cover sheet was removed at room temperature with no material transferring to the cover sheet. The support was bathed in warm water which removed all of the unexposed polymerizable material, leaving a highly useful blue, resist image on the copper-clad support. The resist image may be used to prepare a printed circuit by submitting it to a ferric chloride etching process which leaves a high quality relief image under the resist. After etching, a bath of methylene chloride will swell the polymerized polymer so it can be removed by mechanical scrubbing.

EXAMPLE 14

The following solutions were prepared:

Solution A

| | |
|---|---|
| 1. Triethylene glycol dimethacrylate | 25.0 g. |
| 2. 10% Methyl methacrylate polymer/trichlorethylene | 330.0 g. |
| 3. 2-o-chlorophenyl-4,5-bis-(m-methoxyphenyl) imidazolyl dimer | 1.25 g. |
| 4. Trichlorethylene to bring total weight of solution to: | 500.0 g. |

| | Sol. B | Sol. C | Sol. D |
|---|---|---|---|
| 1. Solution A | 50.0 g. | 50.0 g. | 50.0 g. |
| 2. 5,5-Dimethyl-1, 3-cyclohexane dione | 50.0 mg. | 50.0 mg. | 125.0 mg. |
| 3. 7-Diethylamino-4-methylcoumarin | | 62.5 mg. | 62.5 mg. |
| 4. Alcoblak 322 (25 % carbon black dispersion in isopropyl alcohol) manufactured by Columbian Carbon Company, Inc., New York, N.Y. | | | 6.5 g. |
| 5. Trichlorethylene | | | 28.0 g. |

Two sheets of 0.00075-inch thick polyethylene terephthalate, subbed as in example 1 were coated, one with solution B and the other with solution C, using a 0.002-inch doctor blade opening. Two sheets of drafting film as described in patents to Van Stappen, U.S. Pat. No. 2,964,423 and U.S. Pat. No. 3,227,576, were coated with solution D on the matte side using the same doctor blade opening.

One of the coated drafting film sheets was laminated to the sheet coated with solution B, the other to the sheet coated with solution C, both with their photopolymerizable layers contiguous. The laminating conditions were as follows: temperature 107.5° C., pressure 30–50 p.s.i.a., speed 24 in./min. Both elements were exposed through the clear polyethylene terephthalate side and the positive flat of example 2 to the nu Arc carbon arc light source for 5 seconds. Upon thermal delamination at 87.5° C. and 24 in./min. for each element a positive image remained on the matte surface with a negative image remaining on the other sheet.

Post exposure of both matte surfaces to the nu Arc carbon arc at a vacuum of 25 inches for 2 minutes, resulted in a hard image on both with the surface of the solution C element being less susceptible to smudging.

EXAMPLE 15

The following solution was prepared:

| | Grams |
|---|---|
| Polyoxyethyl trimethylolpropane triacrylate | 100 |
| Poly(methyl methacrylate) | 90 |
| 2-Ethylanthraquinone | 300 |
| Polyoxyethylene glycol mono lauryl ether | 15 |
| 2,2'-Dihydroxy-4-methoxybenzophenone | 2.5 |
| Trichloroethylene | to 1,000 |

A film element was prepared comprising a sheet of 0.001-inch thick polyethylene terephthalate, a coating of the above photopolymerizable solution dried at 55° C., and a temporary base support of 0.001-inch thick polyethylene terephthalate laminated onto the photopolymer layer at 120° C. The polyethylene terephthalate cover sheet was stripped from the film element, and the photopolymer layer was laminated onto a sheet of one-side coated KROMEKOTE paper, manufactured by the Champion Paper Company, at 90 C. The entire photopolymerizable layer was hardened by exposure for 3 min. using a 30-watt white fluorescent lamp, after which the polyethylene terephthalate cover sheet, which served as a temporary base support for the original film element, was removed from the polymer layer at room temperature.

The polyethylene terphthalate cover sheet was stripped from a second identical film element, and a photopolymerizable layer was laminated onto the exposed, paper-supported photopolymerizable layer at 90° C. After stripping the polyethylene terephthalate—which served as the base support for the original film element, but now served as the cover sheet for the paper base support—from the photopolymerizable layer, finely divided Pigment Scarlet C. I. Pigment Red 60) was applied to the layer and pressed into the layer by laminating a sheet of polyethylene terephthalate onto the pigmented layer at 90° C. The photopolymerizable layer was exposed for 45 sec. through a multicolor negative transparency using the nu Arc carbon arc light source of example 1. The polyethylene terephthalate cover sheet was then removed from the pigmented layer, and the layer was sprayed with methanol and washed with cold water to remove the unpolymerized areas of the pigmented layer. The polymerized film element was then dried at room temperature.

The polyethylene terephthalate cover sheet was stripped from a third film element at room temperature, and the clear photopolymerizable layer was laminated onto the exposed pigmented layer at 90° C. After stripping the polyethylene terephthalate sheet from the layer, a dispersion of cellulose acetate extended phthalocyanine blue pigment C. I. Pigment Blue 15) was applied to the photopolymer and pressed into the layer by laminating onto it a sheet of polyethylene terephthalate at 90° C This three-layer film element was then exposed for 45 sec. through the multicolor negative transparency moved slightly from the original position used above, using the nu Arc light source. After stripping the cover sheet from the element, the unpolymerized areas of the pigmented layer were removed by washing with methanol and water. The element was dried at room temperature. A two-color print with little background stain was obtained.

EXAMPLE 16

A 2-color negative print was prepared using the photopolymerizable solution, pigments, support and sequence of steps described in example 15.

After the 2-color print was dried at room temperature, a third layer of the photopolymerizable coating was laminated onto the pigmented layers at 90° C. The polyethylene terephthalate cover sheet was stripped from the paper-supported film element, and Benzidine Yellow pigment C. I. Pigment Yellow 12) was applied to the clear photopolymerizable layer. The pigment was pressed into the clear layer by laminating a sheet of polyethylene terephthalate onto the pigmented layer at 90° C. The film element was exposed for 45 sec. through the same negative multicolor transparency used to produce the images in the other two photopolymer layers but moved to a slightly different position, using the nu Arc light source of example 1. The polyethylene terephthalate cover sheet was then stripped from the pigmented layer, and the unexposed photopolymer areas were washed from the film element with water and methanol. The film element was dried at room temperature to give a 3-color, low-background-stain, negative print.

EXAMPLE 17

| Stock solutions (prepared) | Grams— |
|---|---|
| Triethylene glycol dimethacrylate | 124.8 |
| Methyl methacrylate polymer (low molecular weight density=1.13 g./cc.) | 107.2 |
| Trichloroethylen | 1,400.0 |

| | Solution A | Solution B |
|---|---|---|
| Stock solution | 1,050.00 | |
| 2-o-chlorophenyl-4,5-bis-(m-methoxyphenyl)imidazolyl dimer | 4.50 | |
| 2-mercaptobenzothiazole | 4.50 | |
| Coumarin | 2.25 | |
| Carbon black/methylmethacrylate polymer aqueous dispersion (6-12% solids) | | 180.0 |
| Trichloroethylene | 270.00 | 360.0 |
| Triethylene glycol dimethacrylate | | 12.0 |

| | Solution C [1] |
|---|---|
| Solution A | 200.00 |
| Silicon dioxide (average diameter= 0.7-12μ) | 3.00 |

| | Solution D [2] | Solution E |
|---|---|---|
| Solution C | 20.00 | |
| Solution B | | 20.0 |
| Triethylene glycol dimethacrylate | 1.00 | 1.0 |

[1] Solution C was stirred a half hour at room temperature.

[2] Solution D was coated on subbed 0.001-inch thick polyethylene terephthalate (U.S. Pat. 2,779,684, Example IV) using a .002-inch doctor knife setting. The coating was allowed to dry at 50° C.

Solution C was stirred a half-hour at room temperature.

| | Solution D | Solution E |
|---|---|---|
| Solution C | 20.00 | |
| Solution B | | 20.0 |
| Triethylene glycol dimethacrylate | 1.00 | 1.0 |

Solution D was coated on subbed 0.001-inch thick polyethylene terephthalate (U.S. Pat. No. 2,779,684, example IV) using a 0.002-inch doctor knife setting. The coating was allowed to dry at 50° C.

Solution E was coated on a sheet of drafting film, consisting of a matte surface coating on a clear polyethylene terephthalate support (U.S. Pat. No. 2,964,423), using a 0.002-inch doctor knife setting, and the coating was dried at 50° C.

The two layers were laminated together at 80° C. on a fixed-bed transfer machine (described in Assignee's Chu et al. application Ser. No. 700,117, filed Jan. 24, 1968.

An exposure of 24 sec. through the positive flat of example 2, using the nu Arc light source of example 1, and delamination at 40° C. produced a positive image of good quality.

EXAMPLE 18

| | Grams— Solution A | Solution B |
|---|---|---|
| Stock solution (Example 17) | 525.00 | 122.40 |
| Trichloroethylene | 135.00 | 413.00 |
| 2-o-chorophenyl-4,5-bis-(m-methoxyphenyl)imidazolyl dimer | 2.25 | 1.28 |
| 2-mercaptobenzothiazole | 2.25 | |
| Coumarin | 1.60 | .64 |
| 1,1-dimethyl-3,5-diketocyclohexane | | 1.28 |
| Triethylene glycol dimethacrylate | 33.00 | 28.00 |
| Carbon black/methylmethacrylate polymer aqueous dispersion (6–12% solids) | | 202.00 |
| Silicon dioxide (average diameter=0.7–12 μ) | 10.00 | |

Solution A was coated on subbed 0.001-inch thick polyethylene terephthalate film base (U.S. Pat. No. 2,779,684, example IV) and dried at 55° C.

Solution B was coated on a sheet of translucent drafting film, as in example 17, consisting of a matte surface coating on a clear polyethylene terephthalate support, and the coating was dried at 55° C.

The two coatings were laminated together at 83° C. using the fixed-bed transfer machine of example 17.

A 5-second exposure using the nu Arc light source of example 1, and delamination at 25° C. produced a high quality black image.

EXAMPLE 19

[The following solutions were prepared]

| Stock solution | Grams |
|---|---|
| Triethylene glycol dimethacrylate | 249.60 |
| Methyl methacrylate polymer (low molecular weight density=1.13 g./cc.) | 214.40 |
| Trichloroethylene | 2,800.00 |

| | Solution A | Solution B |
|---|---|---|
| Stock solution | 1,050.00 | 244.80 |
| Trichloroethylene | 270.00 | 826.00 |
| 2-o-chlorophenyl-4,5-bis-(m-methoxyphenyl)imidazolyl dimer | 4.50 | 2.56 |
| 2-mercaptobenzothiazole | 4.50 | |
| Coumarin | 2.25 | 1.28 |
| 1,1-dimethyl-3,5-diketocyclohexane | | 2.56 |
| Triethylene glycol dimethacrylate | 39.90 | 168.00 |
| Carbon black/methylmethacrylate polymer aqueous dispersion (6–12% solids) | | 16.16 |

Solution A was coated on subbed 0.001-inch thick polyethylene terephthalate and dried at 55° C.

Solution B was coated on the matte side of the drafting film of example 17, and the coating was dried at 55° C.

The two coatings were laminated together at 83° C. using the fixed-bed transfer machine of example 17.

A 4-sec. exposure with the nu Arc light source of example 1, followed by room temperature delamination gave a black positive image of high quality.

Examples 17–19 establish that image transfer at room temperature can be accomplished by modifications in the photopolymerizable layers. One modification involves the incorporation of discrete particles, preferably made of transparent material and having an index of refraction nearly equal to that of the photopolymer, into the clear photopolymerizable layer. Addition of this powdered material lowers the cohesive strength of the clear photopolymer layer, which breaks at room temperature upon delamination. Useful powdered materials include aluminum and silicon oxides, cellulose acetate, and clay.

Another method of room temperature transfer, and the method that produces the most satisfactory results, involves increasing the concentration of monomer in the photopolymerizable layers. This increases the adhesion of the layers to the support and cover sheet, while decreasing the cohesive strength of the photopolymerizable layers. For room temperature transfer to be observed, there should be an increase in the ratio of monomer/polymer in the photopolymerizable layer of at least 10 percent. Preferably, the ratio of monomer/polymer should be increased 55 percent.

The polyoxyethyl trimethylolpropane of the foregoing examples is described in Cohen & Schoenthaler, U.S. Pat. 3,380,831, Apr. 30, 1968, and had an average molecular weight of approximately 1,000.

The polyethylene glycol monolauryl ether of the foregoing examples was of high molecular weight and had a density of 95 g./cc.

The embodiments of the invention in which an exclusive property or privilege is claimed are defined as follows:

1. An element for image reproduction comprising
   1. a support, and bearing on a surface thereof, in order,
   2. an unexposed layer of clear photohardenable material which exhibits an increase in stick temperature upon exposure to actinic radiation, and
   3. an unexposed contiguous layer of photohardenable material containing a colorant.

2. An element according to claim 1, wherein said contiguous layer is no thicker than said clear layer.

3. An element according to claim 1, wherein said support is transparent.

4. An element according to claim 1, where the photohardenable layers contain an addition photopolymerizable material and said colorant is particulate.

5. An element according to claim 1, where the photohardenable composition of both layers except for the colorant is identical.

6. An element according to claim 1, where said contiguous layer is covered by an oxygen-impermeable cover sheet.

7. An element according to claim 6, where both said support and said cover sheet comprise a polyester film.

8. An element according to claim 6, where said colorant is a pigment.

9. A process which comprises:
   1. exposing, imagewise, to actinic radiation an element comprising
      a. a support, and bearing on a surface thereof, in order,
      b. an unexposed layer of clear photohardenable material which exhibits an increase in stick temperature upon exposure to actinic radiation, and
      c. an unexposed contiguous layer of photohardenable material containing a colorant; and
   2. transferring unhardened material from unexposed image areas of both layers to a receptor sheet by pressing the sheet into contact with the surface of the contiguous layer and stripping apart the support and receptor sheet, whereby cohesive failure occurs in the unexposed areas of said clear layer without adherence at the image receptor-photohardened interface of the exposed areas, and thereby producing a colored, hardened, negative image adherent to said support and a colored, unhardened positive image adherent to the receptor sheet.

10. A process which comprises:

1. exposing, imagewise, to actinic radiation an element comprising
   a. a support, and bearing on the surface thereof, in order,
   b. an unexposed layer of clear photohardenable material which exhibits an increase in stick temperature upon exposure to actinic radiation, and
   c. an unexposed contiguous layer of photohardenable material containing a colorant;
2. removing unhardened material from unexposed image areas from both photohardenable layers;
3. applying a separate clear photohardenable layer to the surface of exposed photohardenable layer on the adherent support;
4. pressing into said separate clear layer a different particulate colorant;
5. exposing the resulting layer, imagewise, and
6. removing the unhardened areas of the resulting layer to reveal a 2-color image.

11. A process according to claim 10, wherein each photohardenable layer is a photopolymerizable layer.

12. A process according to claim 10, wherein steps 3., 4., and 5. are repeated to reveal a 3-color image.

13. A process according to claim 12, wherein each photohardenable layer is a photopolymerizable layer.

* * * * *

PO-1050
(5/69)

UNITED STATES PATENT OFFICE
CERTIFICATE OF CORRECTION

Patent No. USP 3,615,435 Dated October 26, 1971

Inventor(s) VICTOR FU-HUA CHU and ABRAHAM BERNARD COHEN

It is certified that error appears in the above-identified patent and that said Letters Patent are hereby corrected as shown below:

Column 5, line 35, "05" should read -- #5 --.

Column 5, line 44, "cover" should read -- Cover --.

Column 6, line 23, "$FeCL_3$" should read -- $FeCl_3$ --.

Column 7, line 16, "5/8-inch" should read -- 1/4 inch --.

Column 7, line 51, "D-871-4T" should read -- D-871-54T --.

Column 8, line 44, "p.s.i." should read -- psia. --.

Column 10, line [illegible]

Column 10, line 39, after "1966," and before "U.S." insert an opening parenthesis -- ( --.

Column 11, line 74, after "Scarlet" and before "C.I." insert an opening parenthesis -- ( --.

Column 12, line 15, after "pigment" and before "C.I." insert an opening parenthesis -- ( --.

Column 12, line 36, after "pigment" and before "C.I." insert an opening parenthesis -- ( --.

Column 13, lines 1-14 should be deleted.

Signed and sealed this 6th day of June 1972.

(SEAL)
Attest:

EDWARD M.FLETCHER,JR.
Attesting Officer

ROBERT GOTTSCHALK
Commissioner of Patents